(12) United States Patent
Siegel

(10) Patent No.: US 7,211,299 B2
(45) Date of Patent: *May 1, 2007

(54) UV CURING METHOD AND APPARATUS

(75) Inventor: Stephen B. Siegel, Chicago, IL (US)

(73) Assignee: Con-Trol-Cure, Inc.

( * ) Notice: Subject to any disclaimer, the term of this patent is extended or adjusted under 35 U.S.C. 154(b) by 0 days.

This patent is subject to a terminal disclaimer.

(21) Appl. No.: 10/753,947

(22) Filed: Jan. 7, 2004

(65) Prior Publication Data

US 2004/0166249 A1    Aug. 26, 2004

Related U.S. Application Data

(63) Continuation-in-part of application No. 10/386,980, filed on Mar. 12, 2003, and a continuation-in-part of application No. 10/339,264, filed on Jan. 9, 2003.

(51) Int. Cl.
| | |
|---|---|
| *B05D 3/06* | (2006.01) |
| *C08F 2/48* | (2006.01) |
| *C08F 2/50* | (2006.01) |
| *C08J 7/18* | (2006.01) |
| *H01L 23/467* | (2006.01) |
| *H01L 23/34* | (2006.01) |
| *H01L 27/15* | (2006.01) |
| *H01L 29/861* | (2006.01) |

(52) U.S. Cl. .................... 427/493; 427/508; 427/511; 427/516; 257/88; 118/620; 118/641

(58) Field of Classification Search ................ 427/492, 427/493, 508, 511, 516; 118/620, 641, 642, 118/643; 250/553, 494.1, 504 R, 504 H; 257/88

See application file for complete search history.

(56) References Cited

U.S. PATENT DOCUMENTS 4,010,374 A    3/1977    Ramler (Continued)

FOREIGN PATENT DOCUMENTS

GB    9912437.2    5/1999

(Continued)

OTHER PUBLICATIONS

S.P.Pappas, ed., UV Curing: Science and Technology, Tech. Marketing Corp., Stamford, Conn., USA, excerpts, p. 1 & 101, 1978, no month.*

(Continued)

*Primary Examiner*—Marianne Padgett
(74) *Attorney, Agent, or Firm*—Welsh & Katz, Ltd.; Thomas W. Tolpin

(57) ABSTRACT

A UV curing apparatus and method is provided for enhancing UV curing of inks, coatings and adhesives having UV photo initiators therein by subjecting the UV curable inks, coatings or adhesives to UV light at different wavelengths. Preferably, the UV LED assemblies are alternated in rows and emit light at a wavelength between 180 nm and 420 nm. A row of UV-LED assemblies which emit light in the visible spectrum can be included so a user can visually see if the apparatus is working. A cooling system can be provided for maintaining the UV-LED assemblies at a desired temperature to maintain light intensity and the UV LED assemblies are placed at a distance from the UV curable product which will provide a uniform pattern of light diverging from the UV-LED chips of at least 50% the power output of the UV-LED chips at a viewing cone angle of $2\theta_{1/2}$. Still further the apparatus can be combined with an ink, coating or adhesive having photo initiators that are activated by light at more than one wavelength.

16 Claims, 14 Drawing Sheets

U.S. PATENT DOCUMENTS

| | | | |
|---|---|---|---|
| 4,309,452 A | 1/1982 | Sachs | 427/44 |
| 4,980,701 A * | 12/1990 | Contois et al. | 347/242 |
| 4,990,971 A | 2/1991 | Le Creff | |
| 5,278,432 A | 1/1994 | Ignatius et al. | |
| 5,420,768 A | 5/1995 | Kennedy | |
| 5,535,673 A | 7/1996 | Bocko et al. | 101/211 |
| 5,634,711 A * | 6/1997 | Kennedy et al. | 362/119 |
| 5,660,461 A | 8/1997 | Ignatius et al. | 362/241 |
| 5,762,867 A | 6/1998 | D'Silva | |
| 5,764,263 A | 6/1998 | Lin | |
| 5,857,767 A | 1/1999 | Hochstein | 362/294 |
| 5,986,682 A | 11/1999 | Itou | |
| 6,075,595 A * | 6/2000 | Malinen | 356/328 |
| 6,092,890 A | 7/2000 | Wen et al. | 347/101 |
| 6,112,037 A | 8/2000 | Nagata et al. | |
| 6,145,979 A | 11/2000 | Caiger et al. | |
| 6,163,036 A | 12/2000 | Taninaka et al. | 257/88 |
| 6,188,086 B1 | 2/2001 | Masuda et al. | |
| 6,200,134 B1 * | 3/2001 | Kovac et al. | 433/29 |
| 6,354,700 B1 | 3/2002 | Roth | |
| 6,425,663 B1 | 7/2002 | Eastlund et al. | |
| 6,447,112 B1 | 9/2002 | Hu et al. | |
| 6,457,823 B1 | 10/2002 | Cleary et al. | |
| 6,498,355 B1 | 12/2002 | Harrah et al. | 257/99 |
| 6,525,752 B2 | 2/2003 | Vackier et al. | |
| 6,536,889 B1 * | 3/2003 | Biegelsen et al. | 347/95 |
| 6,561,640 B1 * | 5/2003 | Young | 347/102 |
| 6,630,286 B2 | 10/2003 | Kramer | |
| 6,671,421 B1 | 12/2003 | Ogata et al. | |
| 6,683,421 B1 | 1/2004 | Kennedy et al. | |
| 6,783,810 B2 | 8/2004 | Jin et al. | |
| 6,880,954 B2 * | 4/2005 | Ollett et al. | 362/245 |
| 7,080,900 B2 * | 7/2006 | Takabayashi et al. | 347/102 |
| 7,137,696 B2 * | 11/2006 | Siegel | 347/102 |
| 2001/0030866 A1 | 10/2001 | Hochestein | |
| 2001/0032985 A1 * | 10/2001 | Bhat et al. | 257/88 |
| 2001/0046652 A1 * | 11/2001 | Ostler et al. | 433/29 |
| 2001/0048814 A1 | 12/2001 | Lenmann et al. | 396/154 |
| 2001/0052920 A1 | 12/2001 | Matsumoto et al. | |
| 2002/0016378 A1 * | 2/2002 | Jin et al. | 522/1 |
| 2002/0044188 A1 | 4/2002 | Codos | 347/106 |
| 2002/0074554 A1 | 6/2002 | Sweatt et al. | |
| 2002/0074559 A1 * | 6/2002 | Dowling et al. | 257/99 |
| 2002/0149660 A1 | 10/2002 | Cleary et al. | |
| 2002/0175299 A1 | 11/2002 | Kanie et al. | |
| 2003/0218880 A1 * | 11/2003 | Brukilacchio | 362/293 |
| 2004/0011457 A1 | 1/2004 | Kobayashi et al. | 156/272.2 |
| 2004/0090794 A1 * | 5/2004 | Ollett et al. | 362/555 |
| 2004/0134603 A1 | 7/2004 | Kobayashi et al. | 156/272.8 |
| 2004/0156130 A1 * | 8/2004 | Powell et al. | 359/845 |
| 2005/0104946 A1 * | 5/2005 | Siegel | 347/102 |
| 2005/0152146 A1 * | 7/2005 | Owen et al. | 362/294 |
| 2005/0222295 A1 * | 10/2005 | Siegel | 522/8 |
| 2006/0192829 A1 * | 8/2006 | Mills et al. | 347/102 |
| 2006/0230969 A1 * | 10/2006 | Vosahlo | 101/488 |
| 2006/0237658 A1 * | 10/2006 | Waluszko | 250/372 |
| 2006/0245187 A1 * | 11/2006 | Scott et al. | 362/231 |

FOREIGN PATENT DOCUMENTS

| | | |
|---|---|---|
| GB | 2350321 A | 11/2000 |
| GB | 0215168.6 | 7/2002 |
| GB | 0229825.5 | 12/2002 |
| GB | 2390332 A | 1/2004 |
| GB | 2396331 A | 6/2004 |
| JP | 60-126830 A | 7/1985 |
| JP | 2000-268416 B | 9/2000 |
| JP | 2001-209980 B | 8/2001 |
| JP | 2005-129662 B | 5/2005 |
| WO | PCT/GB2003/002834 | 7/2003 |
| WO | PCT/US2003/023504 | 7/2003 |
| WO | WO 2004/002746 A1 | 1/2004 |
| WO | WO 2004/011848 A2 | 2/2004 |

OTHER PUBLICATIONS

Publication: PCT International Search Report and Written Opinion of International Searching Authority, mailed on Feb. 11, 2005 for International Application No. PCT/US04/21655, International Filing Date Jul. 7, 2004 for Applicant, Con-Trol-Cure, Inc.

Publication: "*Photoinitiators for UV Curing Key Products Selection Guide, Coating Effects*", by Ciba Specialty Chemicals, Edition 2003, Switzerland, no month.

Publication: "*Photoinitiators for UV Curing Formulators' Guide for Coatings, Additives*", by Ciba Specialty Chemicals, Edition 2001, Switzerland, no month.

Publication: "*Optical Properties of Si-Doped $Al_xGa_{1-x}N/Al_yGa_{1-y}N$ (x=0.24-0.53, y=0.11) Multi-Quantum-Well Structures*" by H. Hirayama and Y. Aoyagi, The Institute of Physical and Chemical Research, Saitama, Japan, MRS Internet J. Nitride Semicond. Res. 4S1,G3.74 (1999), no month.

* cited by examiner

UV CURING METHOD AND APPARATUS

CROSS-REFERENCE TO RELATED APPLICATIONS

This application is a continuation-in-part of U.S. application Ser. No. 10/386,980 filed Mar. 12, 2003 and of U.S. application Ser. No. 10/339,264 filed Jan. 9, 2003.

BACKGROUND OF THE INVENTION

1. Field of the Invention

The present invention relates to a method and apparatus for utilizing ultraviolet (UV) light emitted at different wavelength emissions, and arranged in a random, interleafed, mixed or sequential arrangement to cure UV curable inks, coatings or adhesives of varying thickness and/or having selected pigments and additives therein. The inks, coatings or adhesives have UV photo initiators which, when exposed to UV light, convert monomers in the inks, coatings or adhesives to linking polymers to solidify the monomer material.

2. Description of the Related Art

Heretofore, UV-LED arrays have been proposed for curing inks, coatings or adhesives. Thick polymers require longer wavelengths for curing. Surface curing requires shorter wavelengths.

Pigmented coatings are better cured with wavelengths dissimilar to the absorption wavelength of the pigments. This is also true for the wavelength absorption characteristics of resins and additives in an ink, coating or adhesive.

It is, therefore, desirable to provide an improved UV method and apparatus for applying UV light at different wavelengths to a UV curable product to more effectively cure UV inks, coatings and adhesives in or on the product.

BRIEF SUMMARY OF THE INVENTION

As will be described in greater detail hereinafter, the method and device or apparatus of the present invention provide techniques and structures for applying UV light emitted from UV-LED's having a wide range of wavelengths some of which extend into the visible light spectrum. The wavelength range can extend between 180 nm and 420 nm. A preferred wavelength range is between 315 nm and 400 nm.

Also, in one embodiment, a row of UV-LED chips that radiate light in the visible spectrum is added to provide a means for quickly and visually checking to see if the apparatus or device is turned on and working, even if the ink, coating or adhesive does not contain photo initiators that are activated by the light having a wavelength in the visible spectrum.

UV light at two or more different wavelengths can be employed to better cure the ink coating or adhesive in the product. Further, the ink, coating or adhesive can contain photo initiators that are activated by light at more than one wavelength, such as for example photo initiators which are activated by light that is peak at approximately 365 nm and by light that is peak at approximately 385 nm.

Since the intensity of light emitted by UV-LED chips is affected or attenuated, by an increase in the temperature of the UV-LED chips, one embodiment of the present invention contemplates the provision of a cooling system including heat radiating fins on a substrate mounting the chips and the blowing of cooling air past the fins to keep the temperature of the UV-LED chips within a predetermined range.

Also, the temperature of the substrate or the intensity of the light emitted can be monitored and used to control current or voltage to a fan blowing cooling air on the substrate thereby to increase cooling of the substrate to maintain a constant temperature of the substrate thereby to maintain generally constant light intensity as heating of the chips tends to cause light intensity to diminish.

Further "forward voltage matching techniques", $V_F$, are employed, (selection of chips) to provide strings or rows of LED chips wherein the current drawn by the chips only varies between about 5% and about 10%, thereby to minimize "current hogging".

The distance between the light source and the product being irradiated with light affects the intensity of the light. However, if the product is too close to the UV-LED arrays, there will not be a uniform radiance pattern. Accordingly the preferred distance between the UV-LED chip arrays is a distance which will provide a uniform pattern of light from the light diverging from the UV-LED chips and at 50% of the power output from the UV-LED chip. This distance is defined as the Viewing Cone Angle of $2\theta_{1/2}$.

As other UV wavelength emitting diodes become available, a wide range of UV light can be employed in curing apparatus and devices.

Further, to achieve a greater variation of wavelengths, UV-LED chip arrays can be placed next to other sources of light, such as a fluorescent lamp whose phosphors are chosen to augment the increase of light wavelengths. For example, OSRAM SYLVANIA, INC. of Danvers Mass. offers a type 2011C fluorescent lamp that emits 51 nm, a type 2052 that emits 371 nm, a type 2092 that emit 433 nm, and a type 2162 that emits 420 nm.

It is also contemplated that large junction UV-LED chips (over 400 microns on a side) can be employed since they emit UV light at higher light density.

Still further a spacing offset between adjacent rows of 1/x can be provided in an array of UV-LED chips, where x equals the number of rows.

DETAILED DESCRIPTION OF THE INVENTION

A detailed description of the preferred embodiments and best modes for practicing the invention are described herein.

Figure 1:
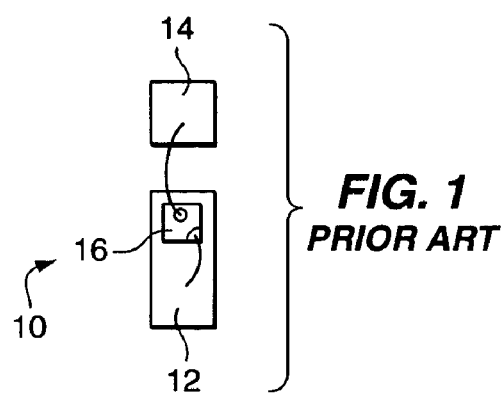
FIG. 1 is a top plan view of a prior art UV LED chip assembly including a pad for a cathode and an anode.

Referring now to the drawings in greater detail, there is illustrated in FIG. 1 a prior art ultraviolet light-emitting diode (UV LED) assembly 10 including a cathode pad 12 and an anode 14 mounting a chip 16, which comprises a UV LED chip 16. Each cathode pad 12 (FIG. 1) is connected to a wire conductor, as is each anode 14.

Figure 2:
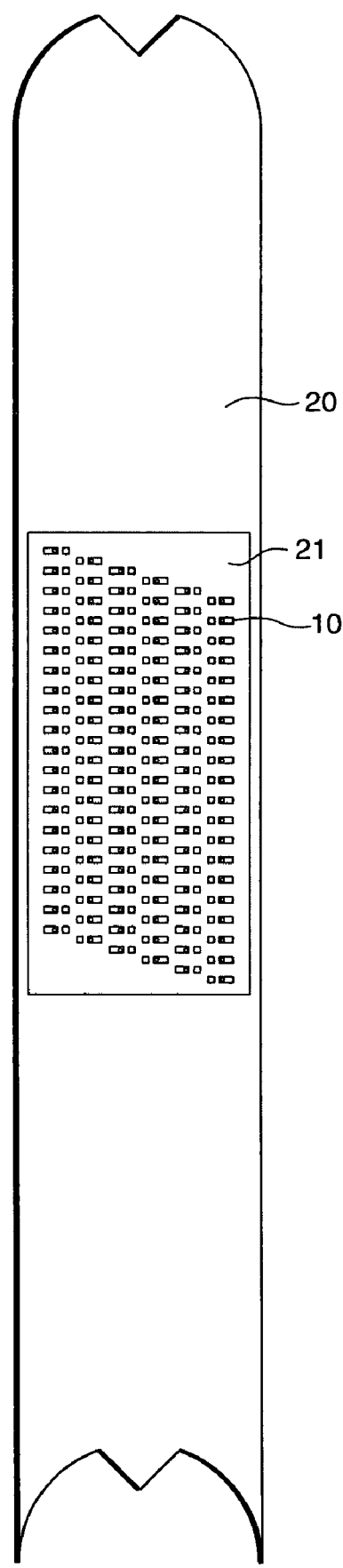
FIG. 2 is a top plan view of a design of mating building blocks or substrates which can be blank or have an anode and cathode mounted thereon in accordance with the teachings of the present invention.
Figure 3:
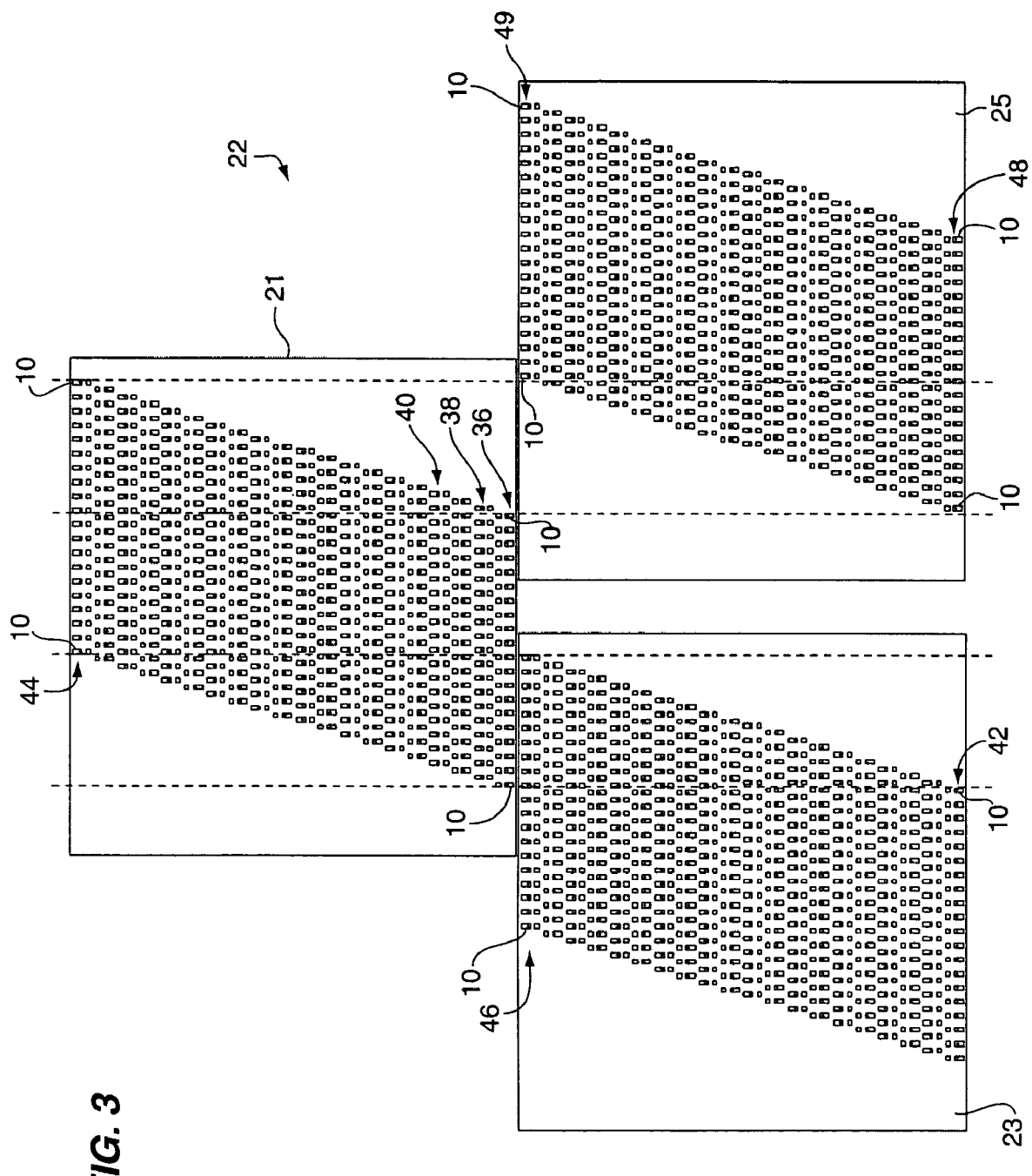
FIG. 3 is a front elevational view of one array of UV LED assemblies wherein rows of UV LED assemblies are arranged in the array with alternate rows of UV LED assemblies in one row being staggered from the UV LED assemblies in the adjacent rows in accordance with the teachings of the present invention.
Figure 4:
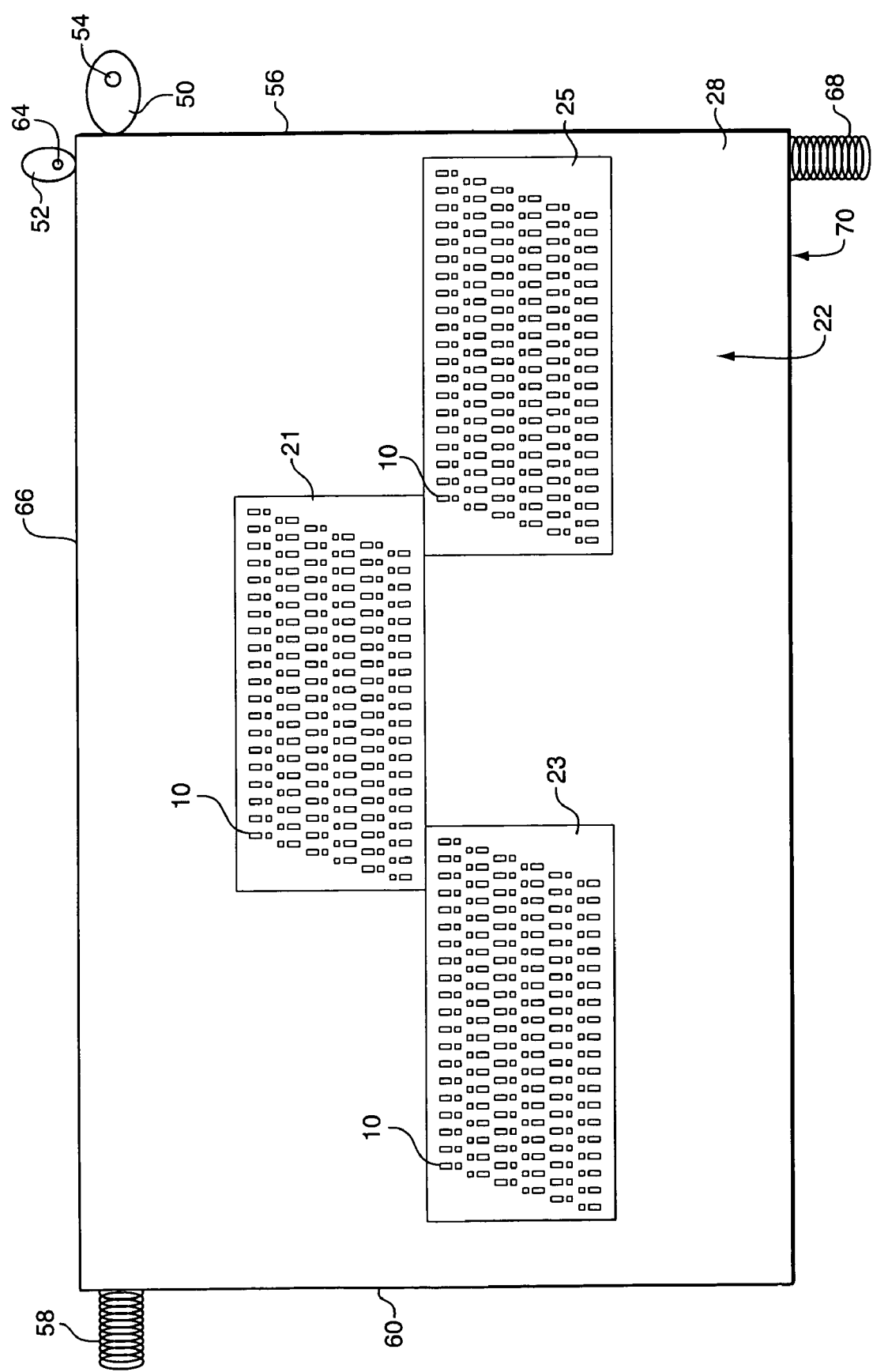
FIG. 4 is front elevational view of a panel of three arrays, each with six rows of UV LED assemblies shown in FIG. 3 in accordance with the teachings of the present invention and shows schematically a first eccentric cam which moves against one side edge of the panel against a spring at the opposite side edge of the panel so as to move, reciprocate or translate the panel in an X direction and a second eccentric cam which acts against an upper edge of the panel and against a spring bearing against a lower edge of the panel to cause movement of the panel in the Y direction and thereby cause all the arrays to move in a orbital, circular, or elliptical path when the first and second cams are rotated.

Referring now to FIG. 2, there is illustrated therein a building block 20 having a first array 21 of the UV LED assemblies 10 thereon, namely, pads 12 and anodes 14, which provide a plurality of UV LED chips 16. The building blocks are designed to mate with similar building blocks to form a group 22 of arrays 21, 23 and 25 as shown in FIGS. 3 and 4. In this way, several of the blocks 20 can matingly engage each other and be arranged in a pattern (e.g., like tiles on a floor) on a panel 28 (FIG. 4).

As shown in FIG. 3, the UV LED assemblies 10 in each array 21, 23 and 25 are spaced apart in a first lower row 36 of UV LED assemblies 10. Then, in a second adjacent row 38, the UV LED assemblies 10 are arranged in a staggered manner so that they are located above the spaces between the UV LED assemblies 10 in the first row. In the same manner, the next upper row 40 of UV LED assemblies 10 is staggered and a total of twenty (20) staggered rows are provided in the UV LED array 21 shown in FIG. 3.

Also, as shown in FIG. 3 the beginning of the first UV LED assembly 10 in the lowest row 36 in the first array 21 is aligned with the end of the last UV LED assembly 10 at the end of the lowest row 42 in the second, lower left, array 23.

Then, the beginning of the first UV LED assembly 10 in the uppermost row 44 in the first array 21 is aligned with the end of the last UV LED assembly 10 in the uppermost row 46 in the second, lower left array 23. Next, the end of the last UV LED assembly 10 in the lowest row 36 in the first array 21 is aligned with the beginning of the first UV LED assembly 10 in the lowest row 48 in the third, lower right array 25. Finally, the end of the last UV LED assembly 10 in the uppermost row 44 in the first array 21 is aligned with the beginning of the first UV LED assembly 10 in the uppermost row 49 in the third, lower right array 25, as shown in FIG. 3.

As shown best in FIG. 4, the three arrays 21, 23 and 25 can be arranged on the panel 28 in a staggered manner so that the UV light from each UV LED assembly 10 is not only spaced and staggered relative to adjacent rows in the array but also spaced and staggered relative to the rows in the other arrays. Also more than three arrays 21, 23 and 25 can be provided, such as six arrays, not shown.

Also shown in FIG. 4, are mechanisms, preferably eccentric cams 50 and 52, that can be provided for moving, translating or reciprocating the panel 28 back and forth in the X direction and up and down in the Y direction, much like in an orbital sander. The first, x axis, eccentric cam 50 is mounted for rotation about a shaft 54 to act against one side edge 56 of the panel 28 with a spring 58, such as a helical tension spring, positioned to act against the other side edge 60 of the panel 28.

Then the second, y axis, eccentric cam 52 (FIG. 4) is mounted for rotation on a shaft 64 to act against an upper edge 66 of the panel 28 against the action of a spring 68, such as a helical tension spring, positioned to act against a lower edge 70 of the panel 28.

Rotation of the shafts 54 and 64 (FIG. 4) each by a prime mover such as a variable speed motor (not shown) can cause the panel 28 to move in a generally orbital, annular, circular, or elliptical path of movement. This will result in orbital movement of each UV LED assembly 10 in each of the rows in each of the arrays 21, 23 and 25 mounted on the panel 28 so as to spread out the emitted UV light and uniformly apply the UV light to the products, articles or other objects to be UV cured. This spreading of the UV light also minimizes, if not altogether eliminates the creation of, so called "hot spots" of UV light.

Figure 5:
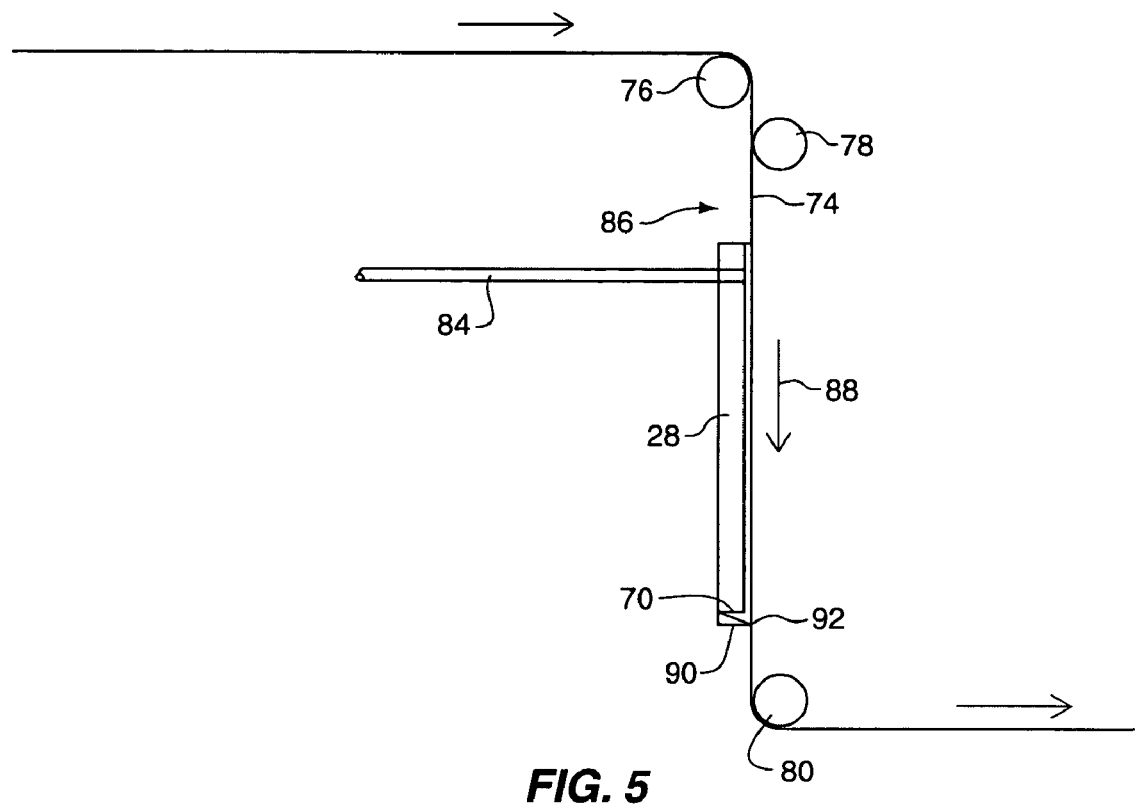
FIG. 5 is a block schematic diagram of a web made of, or carrying products, articles or other objects to be UV cured wherein the web is trained over rollers to move in a generally vertical path past the panel of arrays of UV LED assemblies shown in FIG. 4 such that the products, articles or other objects with UV photo initiators therein can be cured as each product, article or other object moves past the arrays of UV LED assemblies while a non-oxygen, heavier than air gas is injected from a gas tube located near the top of the path of movement of the web.

As shown in FIG. 5, where a schematic block diagram of one UV curing apparatus, assembly, mechanism or device constructed according to the teachings of the present invention is shown, the panel 28 of UV LED arrays 21, 23 and 25 is positioned generally vertically and closely adjacent the path of movement of a conveyor belt comprising a web 74 which is trained over rollers 76, 78 and 80 to move generally upright and vertically past and closely adjacent and in proximity to the panel of UV LED arrays 21, 23 and 25. For this purpose, at least one of the rollers 76, 78 and/or 80 of a conveyor can be a drive roller.

UV curable products, articles or other objects, such as labels, positioned in or on the web 74 (FIG. 5), can have one or more UV curable inks, coatings and/or adhesives between a plastic cover layer and the label. The UV curable ink, coating, and/or adhesive can have UV photo initiators therein which will polymerize the monomers in the UV curable ink, coating, or adhesive when subjected to UV light within a predetermined UV wavelength range.

The UV curable ink, coating and/or adhesive preferably is located on the side of the web 74 (FIG. 5) that is closest to and faces the panel 28. Preferably, the UV LED assemblies are in close proximity to the ink, coating or adhesive and no closer than a viewing cone angle, $2\theta_{1/2}$, where the cone of light that emanates from an UV-LED chip is at least 50% of the light power output of the chip. Note that the effectiveness of the UV emitted light dissipates exponentially as the distance to the product, article or other UV curable object to be treated increases.

Preferably, the cams 50 and 52 (FIG. 4) are rotated to cause orbital movement of the panel 28 and UV LED assemblies as the web 74 containing the product, article or other UV curable object moves past the panel 28. Such movement also minimizes "hot spots" or "cold spots" and provide uniform sweeping, distribution, and application of the UV light from the UV LED assemblies 10.

The block schematic diagram of the assembly or device, shown in FIG. 5 is provided to minimize exposure of the products, articles or other objects during curing to oxygen, which inhibits UV curing. A gas tube 84 providing an upper gas injection is provided on the assembly and device for injecting a heavier-than-air gas not containing oxygen gas, e.g., carbon dioxide, near an upper end 86 of a path of downward movement, indicated by the arrow 88, of the web 74, so that the gas can flow downwardly in the space between the panel 28 and the web 74 to provide an anaerobic area between the UV LED assemblies 10 on the panel 28 and the web 74 having UV curable products, articles or other objects to be cured.

A wiper blade 90 (FIG. 5) providing a lower inhibitor can be positioned adjacent the lower edge 70 of the panel 28 for holding, compressing, collecting and/or blanketing the gas in the area between the orbiting UV LED arrays 21, 23 and 25 (FIG. 4) and the moving web 74 (FIG. 5). Preferably the wiper blade 90 is fixed to the lower edge 70 of the panel 28 and has an outer edge 92 that is positioned to wipe close to or against the moving web 74. In this way, the injected gas can be inhibited from escaping the curing area.

Figure 6:
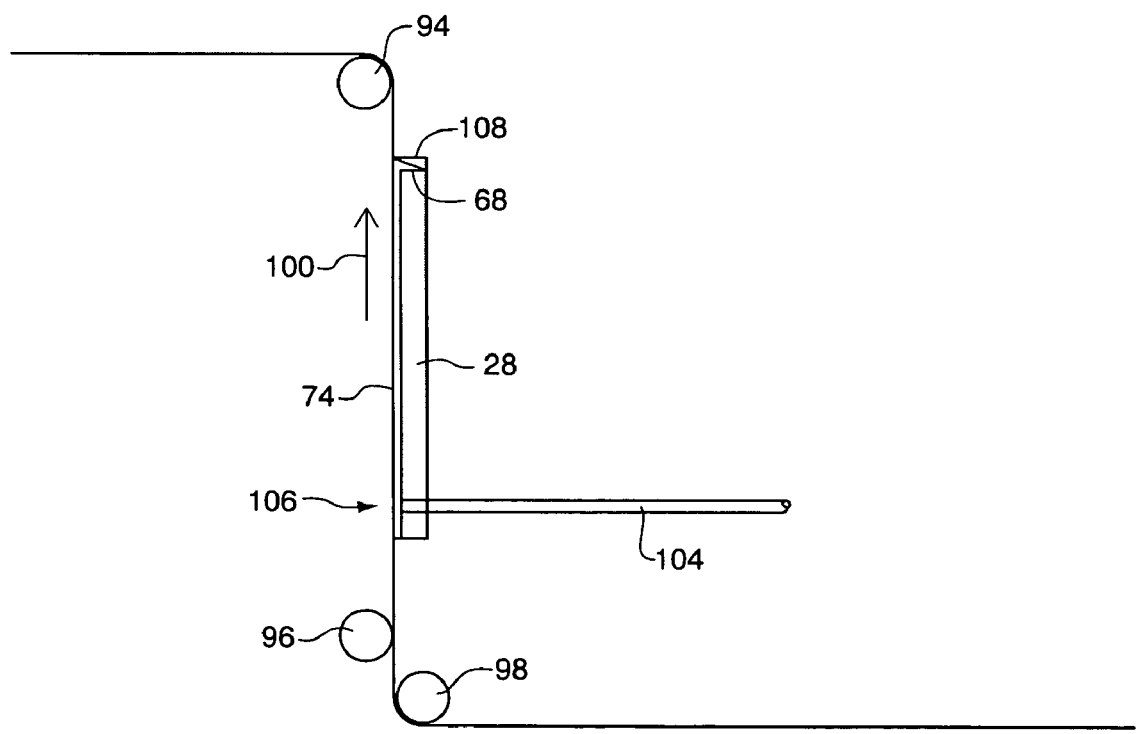
FIG. 6 is a block schematic view of a web made of, or carrying, products, articles or other objects to be UV cured wherein the web is trained over rollers to move in a generally vertical path past the panel of arrays of UV LED assemblies shown in FIG. 4 such that each product, article or other object with UV photo initiators therein can be cured as each product, article or other object moves past the arrays of UV LED assemblies while a non-oxygen gas is injected from a gas tube located near the bottom of the path of movement of the web.

FIG. 6 is a block schematic diagram of a UV curing apparatus, assembly, mechanism or device constructed according to the teachings of the present invention where the moving web 74 is trained about rollers 94, 96 and 98, at least one of which can be a drive roller, to cause the web 74 with the UV curable products, articles or other objects thereon or therein to move upwardly, as shown by the arrow 100, past the panel 28 mounting arrays 21, 23 and 25 (FIG. 4) of UV LED assemblies, much the same as in the UV curing apparatus, assembly and device shown in FIG. 5.

In the apparatus, assembly or device shown in FIG. 6, a gas tube 104 providing a lower gas injector is positioned near a lower end 106 of the path 100 of movement of the web 74 for injecting an inert lighter-than-air, non-oxygen-containing gas, e.g., helium, in the area between the orbiting panel 28 (FIG. 4) and the upwardly moving web 74 (FIG. 6) to thereby provide an anaerobic area to enhance and facilitate curing of the UV photo initiators in the UV curable products, articles or other objects that are carried by the web 74.

A wiper blade 108 (FIG. 6) providing an upper inhibitor 108 is positioned near the upper edge 68 of the panel 28 as shown in FIG. 6 to minimize the escape of the lighter-than-air gas and hold, compress, collect and/or blanket the injected gas in the curing area between the orbiting panel 28 (FIG. 4) and the moving web 74 (FIG. 6), much the same as in the UV curing apparatus, assembly and device shown in FIG. 5. Again, the wiper blade 108 (FIG. 6) can be fixed to the upper edge 68 and arranged to wipe close to or against the web 74.

To avoid overheating the UV LED assemblies 10, i.e., to control the heat generated by the UV LED assemblies 10, the power supplied to the UV LED assemblies can be periodically or sequentially activated and deactivated, i.e. can be turned on and off, at a relatively high frequency. Also, the duty cycle of the on-off cycle can be varied to adjust the UV light intensity.

Figure 7:
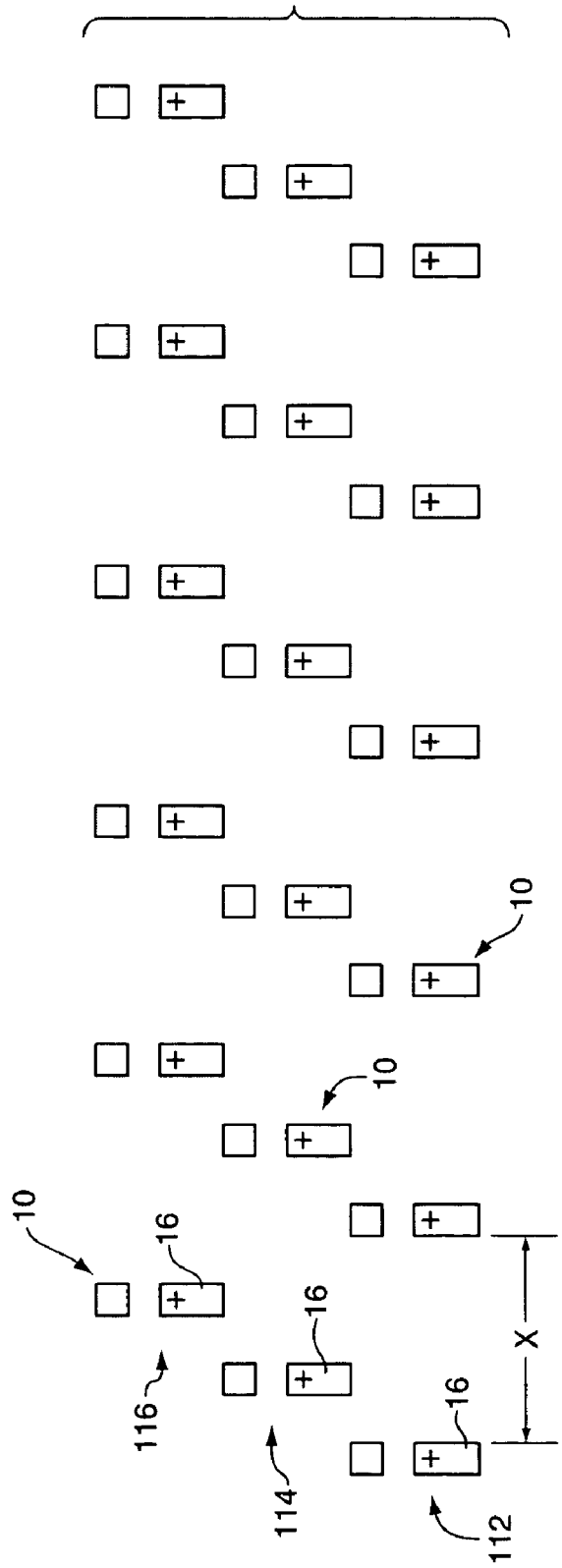
FIG. 7 is a plan view of another way of positioning UV LED assemblies in at least three rows where the spacing between UV LED assemblies in each row is increased to establish a three tier staggering of UV LED assemblies.

In FIG. 7 is illustrated another way to position the UV LED assemblies, namely, the LED chips 16, and achieve the same uniformity as shown in FIG. 2. This would be to use 3 rows to achieve the uniformity. That is, to have the LED chips 16 in a first row 112 arranged at a distance of X, and to have the next row 114 (row 2) start at a distance ⅓ in from the start of the first row 112 and the next row 116 (row 3) start at a distance ⅔ in from the start of the first row 112 or at a distance ⅓ in from the start of the second row 114.

It will be understood that the space X can be equal to the width of 1, 2, 3, 4, 5, etc. of an UV LED assembly 10 to provide a desired staggering of the light beams from the UV LED assemblies 10. Preferably x equals the number of rows.

Also, in situations where UV curable ink or adhesive might splatter on the UV LED assemblies 10, a clear/transparent protective sheet or layer of plastic material can be placed over the arrays 21, 23 and 25 to protect the UV LED assemblies 10. Then, the protective sheet or layer is cleaned or replaced periodically.

Figure 8:
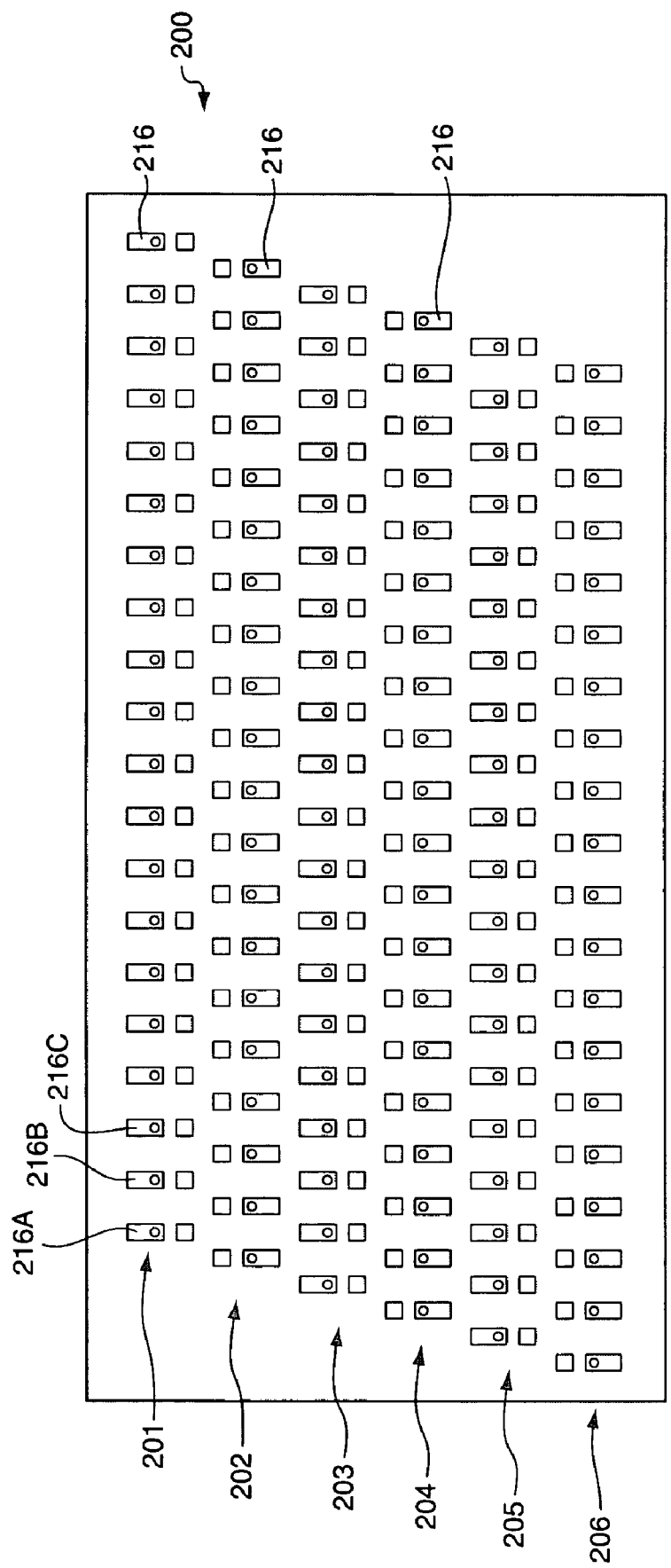
FIG. 8 is a plan view of a staggered array of UV LED assemblies (UV-LED arrays) which emit UV light at different wavelengths.

In the array 200 shown in FIG. 8, there are illustrated six (6) staggered rows 201–206 of UV LED assemblies 216. This array 200 is similar to the array shown in FIG. 2. However, the individual UV LED assemblies 216 in the array have different wavelengths for applying UV light having different wavelength emissions which can be more effective in curing inks, coatings and adhesives having UV photo initiators therein and having a varying thickness.

It is to be understood that UV light emitted from an LED or from a fluorescent lamp is over a range of wavelengths, often referred as the Spectral Energy Distribution with a peak at one wavelength which is the identified wavelength, e.g. 370 nm.

The UV LED assemblies can be positioned in a random, mixed manner or in sequential rows. For example, in row 201 the first UV-LED assembly 216A can emit light at 390 nm, the next UV LED assembly 216B can emit UV light at 370 nm and the following UV LED assembly 216C can emit UV light at 415 nm, and so on, repeating this pattern throughout the row. The next row 202, and subsequent rows 203–206, can have the same pattern or a different pattern.

Alternatively, all the UV LED assemblies 216 in row 201 can emit light at 390 nm, all the UV LED assemblies 216 in row 202 can emit light at 370 nm and all the UV LED assemblies 216 in row 203 can emit light at 415 nm and this pattern can be repeated for the remaining rows 204–206. The pattern or order also can be changed, e.g., 370 nm, 390 nm, and 415 nm.

Another variation would be a random mixture of UV LED assemblies which emit light at 415 nm, 390 nm and 370 nm or other wavelengths as such UV wavelength emitting diodes become available, e.g., 350 nm, 400 nm and 420 nm.

Figure 9:
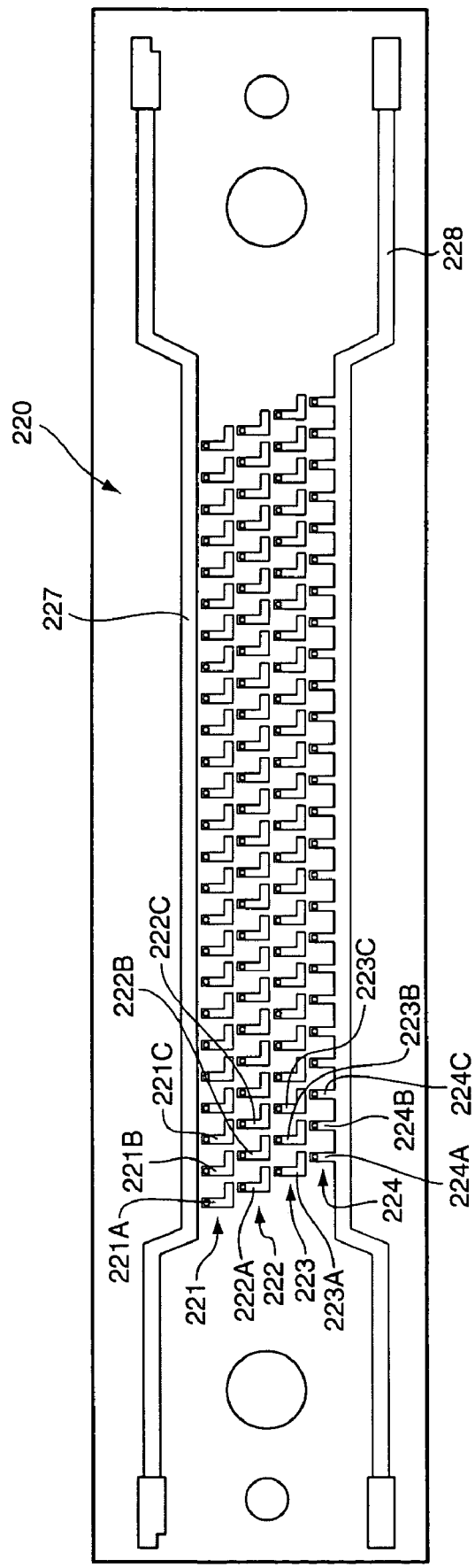
FIG. 9 is a plan view of one die array of four rows of LED chips.

In FIG. 9 is illustrated a lamp panel array 220 of four rows 221–224 of UV LED assemblies 226. The panel array 220 can be about four inches long and has two bus strips 227 and 228.

Figure 10:
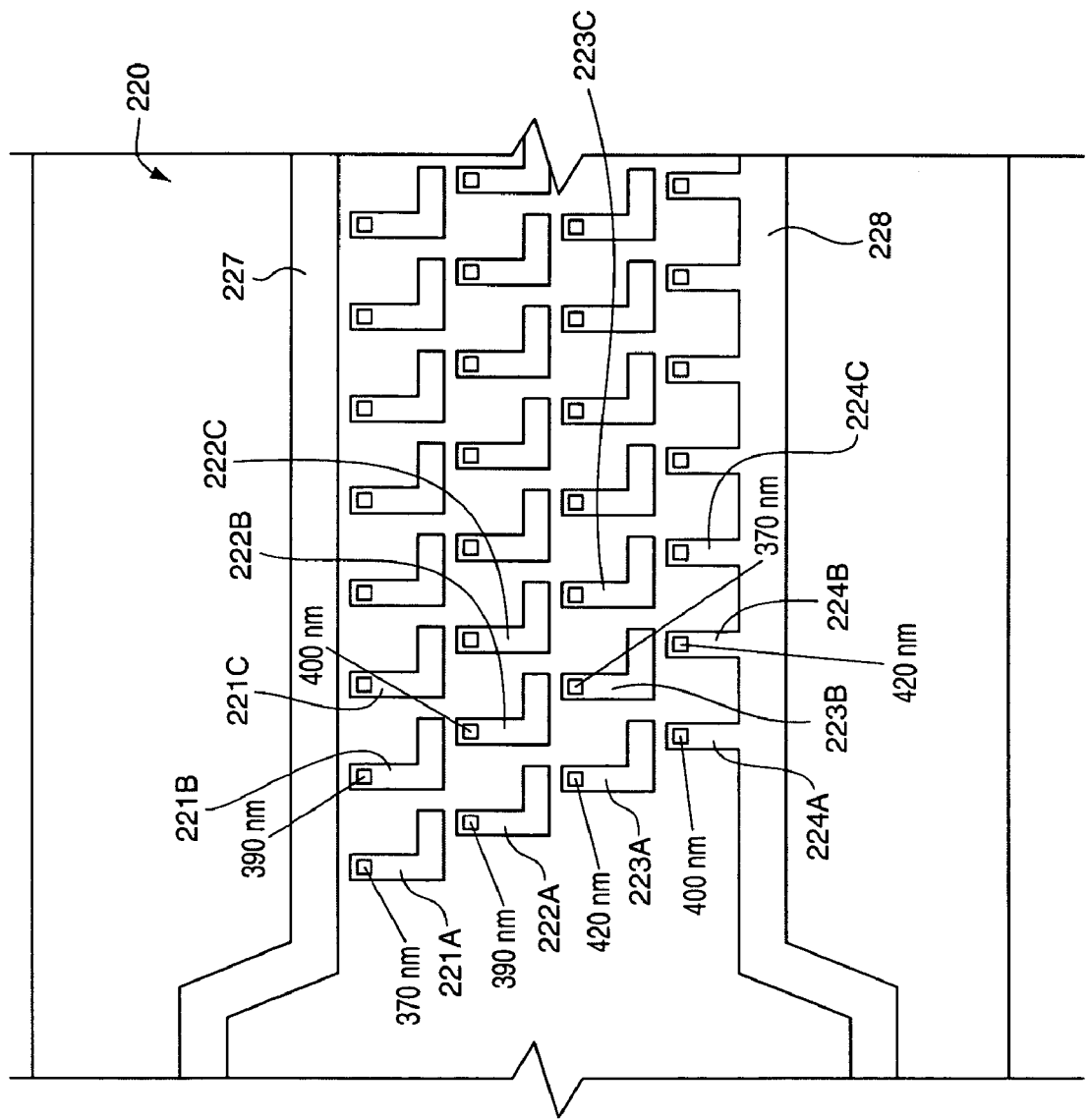
FIG. 10 is an enlarged view of a portion of the array shown in FIG. 9.

As shown in FIG. 10 the first UV LED assembly 221A in the first row 221 can emit light at 370 nm, the first UV LED assembly 222A in the second row 222 can emit light at 390 nm, the first UV LED assembly 223A in the third row 223 can emit light at 420 nm, and the first UV LED assembly 224A in the fourth row 221 can emit light at 400 nm.

The second UV LED assembly 221B in the first row 221 can emit light at 390 nm, the second UV LED assembly 222B in the second row 222 can emit light at 400 nm, the second UV LED assembly 223B in the third row 223 can emit light at 370 nm, and the second UV LED assembly 224B in the fourth row 224 can emit light at 420 nm.

The third UV LED assembly 221C, 222C, 223C and 224C in each row 221–224 can then emit light at, respectively, 420 nm, 390 nm, 400 nm and 370 nm. It will be understood that the UV LED's emit UV light in a spectral range and the peak wavelength in the spectral range is the wavelength identified.

Further, to achieve the greatest variation of wavelengths, the panel array 220 can be arranged next to another source of light, such as a fluorescent lamp (or lamps) whose phosphors are chosen to augment the increase of light wavelengths. For example, the OSRAM SYLVANIA, INC. Division of OSRAM GmbH of Danvers Mass. offers a phosphor type 2011C fluorescent lamp that emits 351 nm, a phosphor type 2052 lamp that emits 371 nm, a phosphor type 2092 lamp that emits 433 nm, and a phosphor type 2162 lamp that emits 420 nm.

These are several examples of wavelengths that easily can be added to a curing mix. Additionally, a germicidal lamp or a Pen Ray lamp can be used for the addition of 254 nm.

Figure 11:
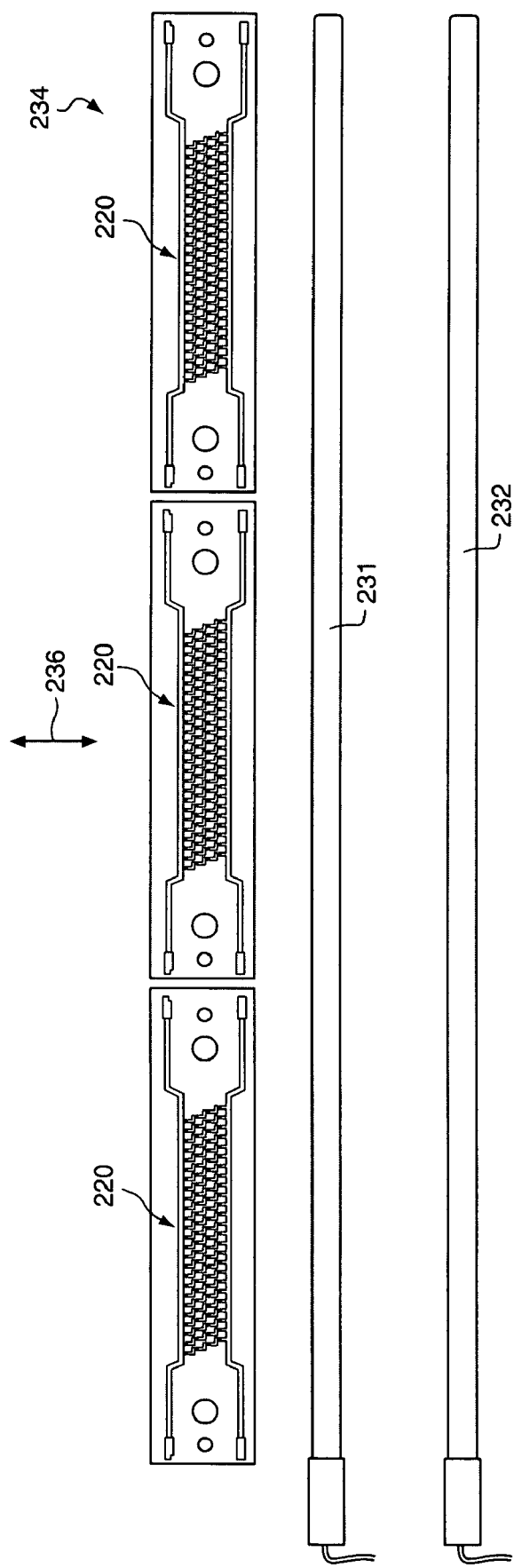
FIG. 11 is an arrangement or line of three of the arrays shown in FIG. 9 and two long fluorescent lamps positioned beside the line of arrays.

In FIG. 11, two fluorescent lamps 231 and 232 are illustrated which can be positioned adjacent an elongate panel 234 formed by three panel arrays 220 arranged end-to-end and electrically connected (soldered) together. A web, similar to the web 74, and carrying a UV curable product can be arranged to move across the elongate panel 234 as indicated by the arrow 236.

It will be understood that a number of panel arrays 220, e.g., three (3)–eight (8) can be arranged end to end to form a UV light emitting area and that more than one or two fluorescent lamps can be used with the light emitting area.

The panel 234 can be oscillated, such as with cams (see FIG. 4), with a significant sweep to ensure overlapping of the four different wavelengths.

The UV curable product can also traverse the two fluorescent lamps 231 and 232 and any additional light sources employed.

In some embodiments of the product, the ink, coating or adhesive can have two or more photo initiated monomers which are activated at two or more frequencies, such as for example, 365 nm and 385 nm and the light rays directed onto the product will include light at those wavelengths.

Also, as provided in the structures shown in FIGS. 5 and 6 and described above, an inert gas can be injected into the space between the panel 234 and the moving web having a UV curable product therein or thereon.

Empirical tests show that LED chips with a larger area can emit higher intensity UV light. This feature can be important where the space between the panel 234 and the web is a factor in the curing. In this respect a large junction area LED chip emits more light than a small junction LED chip. A large junction chip can have 400 or more microns per side and a small junction chip can have less than 400 microns on a side. The larger chips are referred to as large junction LED's and provide a higher light density than small junction LED chips.

Figure 12:
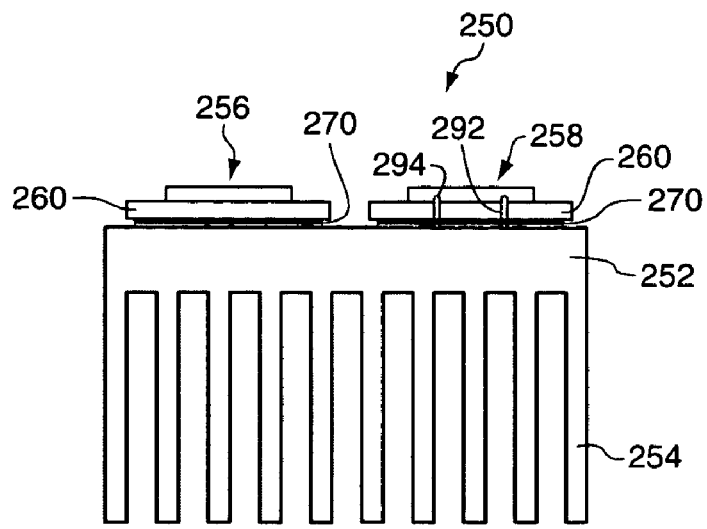
FIG. 12 is a side elevational view of UV LED arrays mounted on a porcelain coated substrate which in turn is mounted on an aluminum heat sink having heat dissipating fins.

In FIG. 12 there is illustrated a linear UV LED array assembly 250 which includes an aluminum heat sink 252 having heat dissipating fins 254 extending therefrom. On top of the heat sink 252 are two porcelain coated steel substrates 260 on which are mounted UV LED chip arrays 254 and 256 which are similar to the arrays shown in FIG. 9. Beneath the porcelain coated steel substrate 260 of the arrays 256 and 258 there is provided a heat sink compound 270 for securing the porcelain coated steel substrates 260 to an upper surface of the heat sink 252. It will be understood that the heat sink compound 270 not only holds the UV LED chip arrays 256 and 258 to the upper surface of the heat sink 252 but also conducts heat from the UV LED arrays 256 and 258 to the heat sink 252.

Figure 13:
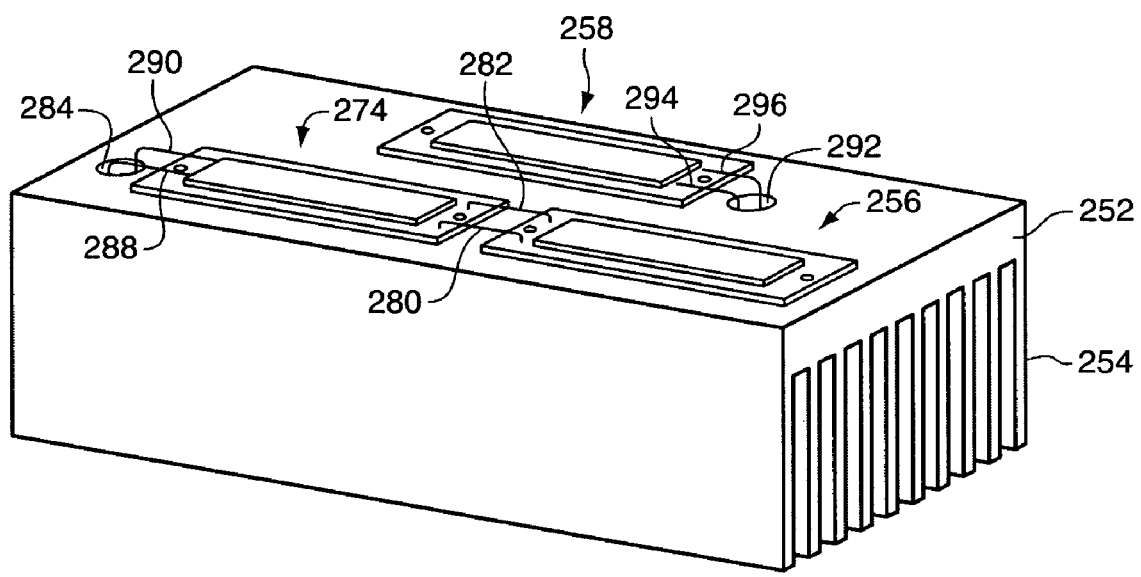
FIG. 13 is a side perspective view of the UV LED arrays shown in FIG. 12 and shows passages through the heat sink for the passage of power supply conductors to the UV-LED arrays.

FIG. 13 is a perspective view of the UV LED array assembly 250 shown in FIG. 12. Here it will be seen that a second UV LED chip array 274 is positioned behind UV LED chip array 256 and they are connected together with wire conductors 280 and 282. Also, it will be seen that the heat sink 252 is provided with a passageway 284 which extends generally parallel to the heat fins 254 and is located to receive a pair of power supply wire conductors 288 and 290 from the UV LED chip array 274. Additionally, another passageway 292 is provided in the heat sink 252 extending generally parallel to the heat dissipating fins 254 adjacent the UV LED chip array 258 for receiving a pair of power supply wire conductors 294 and 296 extending from the UV LED chip array 258.

Figure 14:
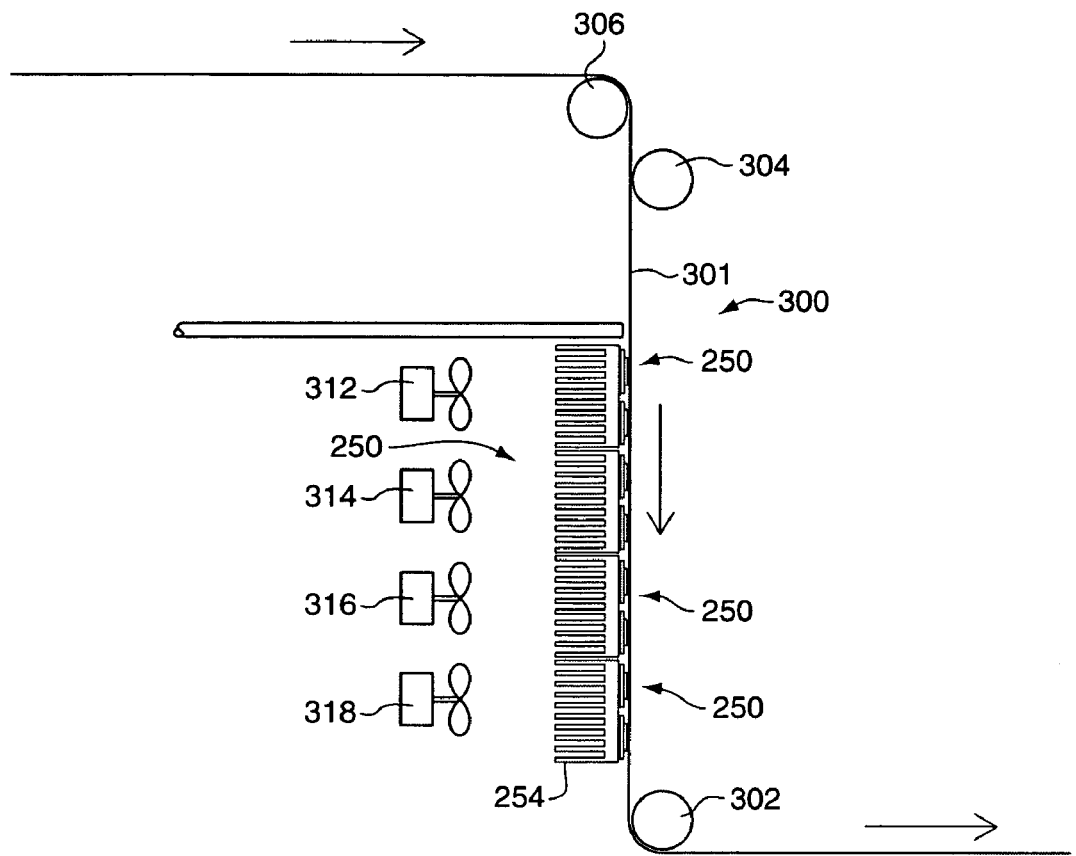
FIG. 14 is a view similar to FIG. 5 except that it shows four of the heat sink mounted UV-LED arrays shown in FIGS. 12 and 13 are mounted adjacent the moving web of product and shows four fans for applying cooling air to the heat dissipating fins of the heat sinks.

FIG. 14 is a block diagram of a UV curing apparatus 300 that includes a plurality, e.g., four, UV LED chip array assemblies 250. The assemblies 250 can be fixed together and can be oscillated, such as by cams, similar to the oscillation of the panel 28 shown in FIG. 5.

A web 301 (FIG. 14) is trained over rollers 302, 304, and 306 to pass closely adjacent and in close proximity to the bank of UV LED chip array assemblies 250. One of the rollers 302, 303 or 304 can be driven roller of a conveyor.

In the embodiment of FIG. 14, heat dissipation is provided by the heat dissipating fins 254 of the bank of UV chip array assemblies 250. This is important since the intensity of light from the UV LED chips in the arrays 256, 258 and 274 can be attenuated by the heating up of the UV LED chip arrays 256, 258 and 274. Accordingly, in this embodiment the temperature of UV LED chip arrays 256, 258 and 274 is kept within a predetermined temperature range by dissipating heat through the heat dissipating fins 254.

Temperature control of the temperature of the UV-LED arrays 256, 258, and 274 in FIG. 5 can be enhanced further by the provision of fans such as the fans 312, 314, 316 and 318 shown in FIG. 14. It will be understood that temperature sensors can be provided on the heat sink 252 for indicating, to a control circuit (not shown) for the fans 312–318, the temperature of the arrays. The control circuit can cause the fans 312–318 to turn on when the sensors sense a temperature above a certain value and to turn off when the sensors sense a temperature below a certain value. In this way, the light density of the light rays from the UV LED chips can be maintained at a high level.

Figure 15:
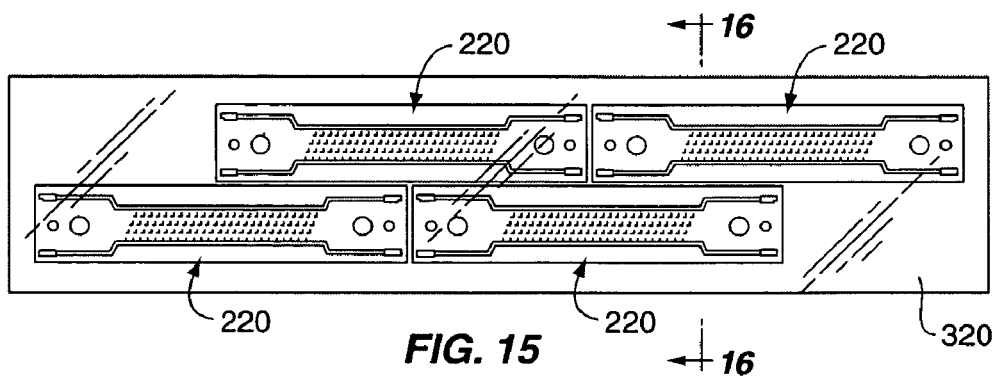
FIG. 15 is a plan view of four UV-LED arrays of the type shown in FIG. 11 covered with a sheet of glass or plastic material to protect the LED arrays from splatter.

FIG. 15 shows a plurality of four arrays 220 similar to the arrays shown in FIG. 9 mounted on a substrate and covered with a protective sheet of glass or plastic 320 providing a cover or envelope to protect the LED arrays 220 from splatter.

Figure 16:
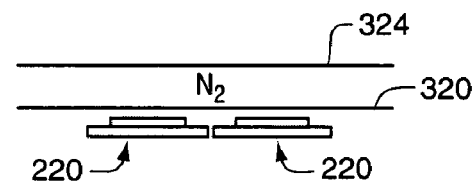
FIG. 16 is a fragmentary sectional view of the UV-LED arrays shown in FIG. 15 and shows the product located above the glass or plastic protective layer and shows a layer of nitrogen gas between the product and the glass or plastic protective layer.

FIG. 16 is a sectional view of a portion of the covered UV LED chip array panels 220 shown in FIG. 15. Here a product 324 to be cured is shown above the glass or plastic cover sheet 320 and nitrogen gas is supplied to the area between the product 324 and the cover sheet 320. Then, of course, below the cover sheet 320 are the UV LED chip array panels 220.

Figure 17:
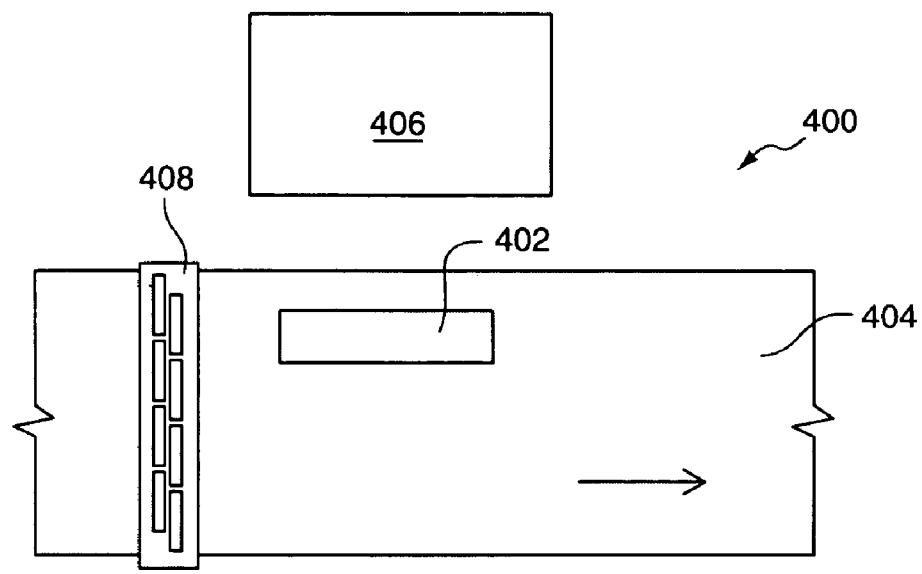
FIG. 17 is a top plan view of a printing and curing station where a product is printed, then placed on a support or a conveyor and an UV-LED array is passed over the printed product or the conveyor is moved under the UV-LED array to cure the print.
Figure 18:
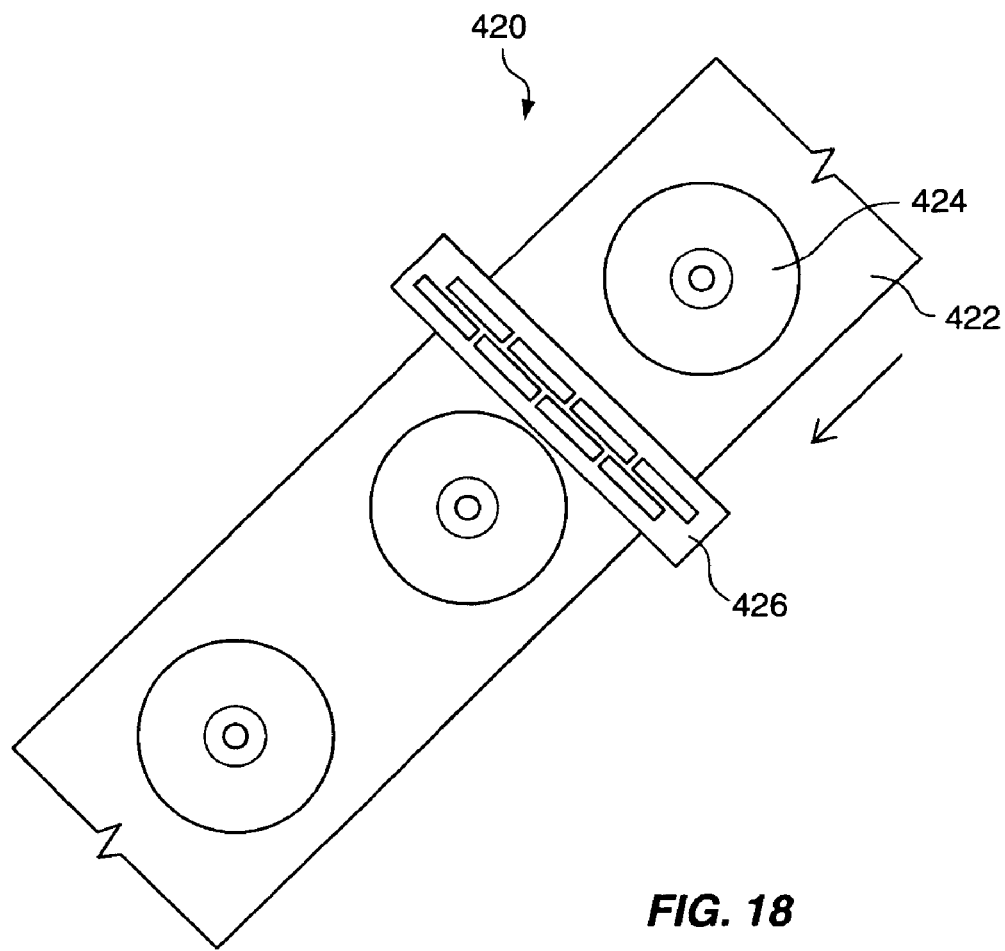
FIG. 18 is a top plan view of a conveyer carrying printed compact discs under a UV-LED array.

In FIG. 17 there is shown a printing and curing station 400 where a product 402 (shown on an adjacent support 404) is printed at a printing station 406 and then placed on the support 404 (which can be a support conveyor as shown in FIG. 18) where an assembly 408 of UV-LED arrays 408 is moved or reciprocated over the freshly printed product (or the support conveyor is moved under the assembly 408 of UV-LED arrays) to cure the print. The product 402 can be planar or have a curved shape, such as a cell phone housing.

In FIG. 18 there is shown a curing station 420 where a conveyor 422 carrying printed compact discs 424 is moved under an assembly 426 of UV-LED arrays.

Figure 19:
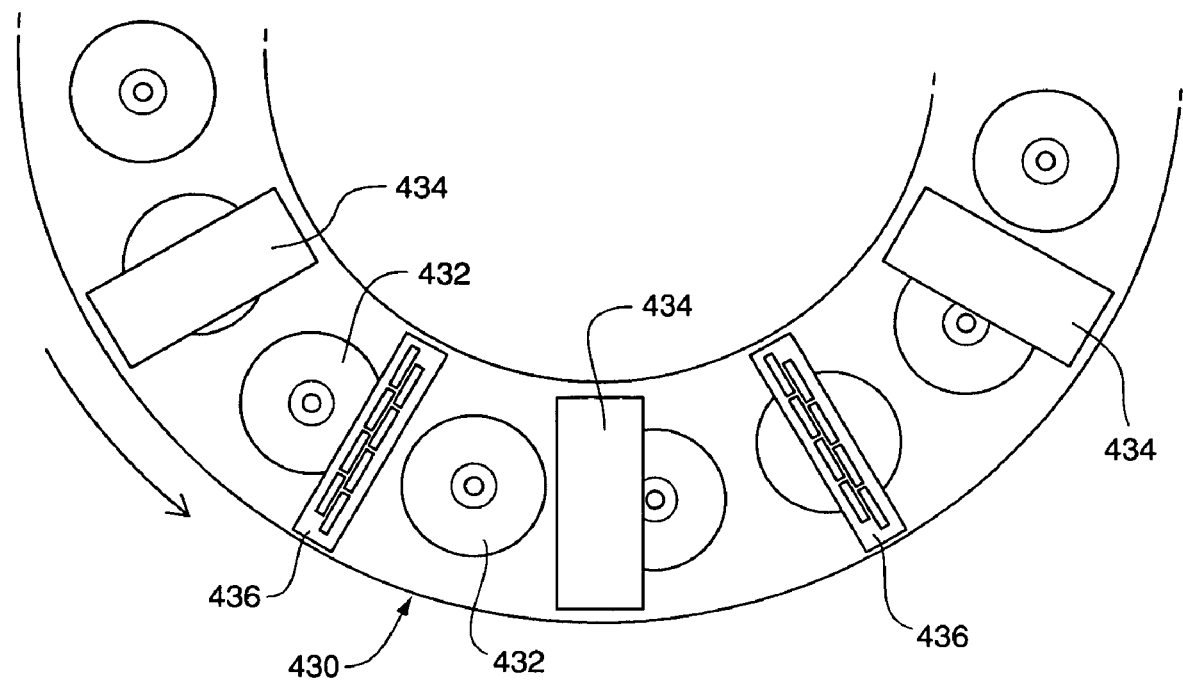
FIG. 19 is a top plan view of a turntable carrying compact discs which is indexed first to move the compact discs under spaced print heads where a printing of a compact disc takes place followed by a second indexing to move the freshly printed compact discs past spaced UV-LED arrays for curing of the print.

In FIG. 19 there is shown a turntable 430 for carrying compact discs 432 beneath print heads 434 and assemblies 436 of UV-LED arrays. The turntable is first indexed to move the compact discs 432 under the spaced apart print heads 434 where printing of compact discs 432 takes place followed by a second indexing of the turntable to move the freshly printed compact discs 432 past the spaced apart assemblies of UV-LED arrays for curing of the print.

Figure 20:
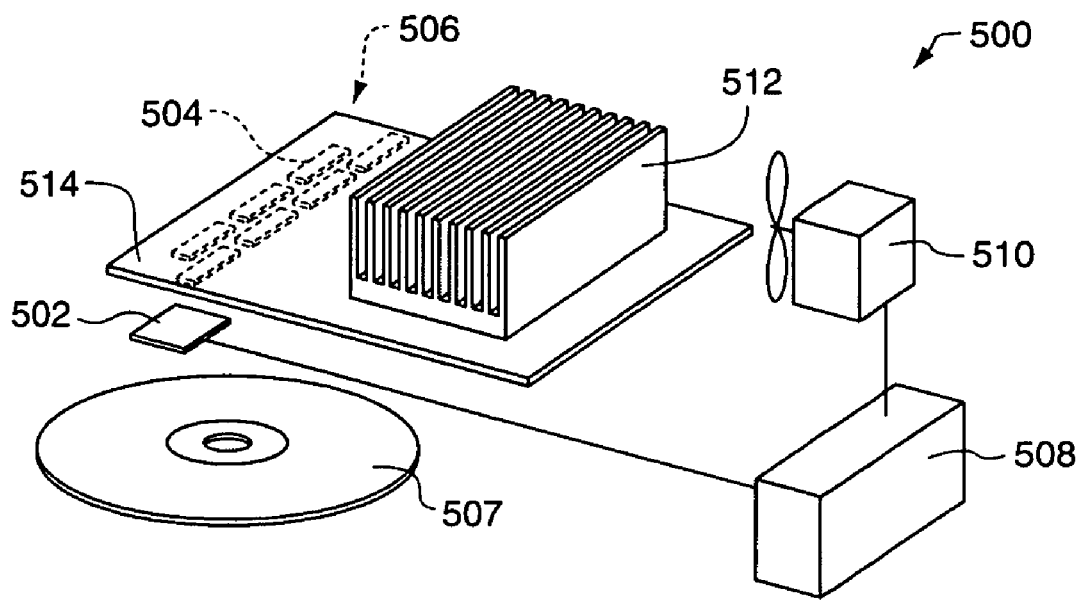
FIG. 20 is a block schematic diagram of a system for maintaining generally constant light intensity from an UV-LED assembly mounted on a substrate also mounting a heat sink by monitoring light intensity with a light sensor and then controlling the current or voltage to a variable speed cooling fan blowing on the heat sink dependent on the light intensity sensed for increasing cooling as UV-LED chips in the UV-LED assembly heat up thereby to maintain a generally constant temperature which results in a generally constant light output from the UV-LED chips.

Since heat is generated by UV-LED chips when they are emitting light, and the light intensity decreases as the temperature increases, it is desirable to maintain a generally constant temperature of the UV-LED chips to maintain a generally constant light intensity/output. This can be accomplished with several different systems. As shown in FIG. 20, one system 500 for maintaining generally constant light intensity is graphically illustrated. Here, the system 500 includes a light sensor 502 for monitoring light intensity from the UV-LED chips in the UV-LED arrays 504 in an assembly 506 of UV-LED arrays 504 that is directed toward a printed product 507, e.g., a compact disc (CD). The intensity of the light sensed is used by a control circuit 508 to control the current or voltage to a variable speed fan 510 blowing cooling air on a heat sink 512 mounted on a substrate 514 that also mounts the assembly 506 of the UV-LED arrays 504. As the UV-LED chips heat up, the speed of the fan 510 is increased to increase the cooling of the heat sink 512 to cool the heat sink 512 and the UV-LED chips mounted on the substrate 514, thereby to maintain the UV-LED chips at a generally constant temperature which results in a generally constant light output from the UV-LED chips.

Figure 21:
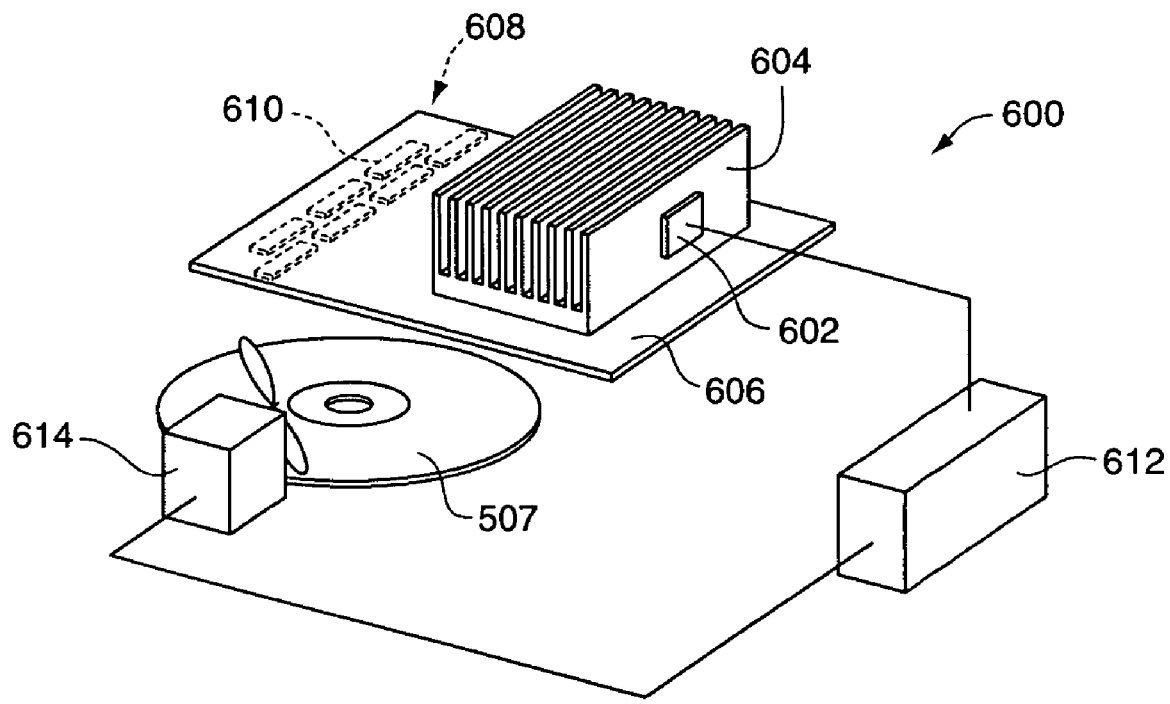
FIG. 21 is a block schematic diagram, similar to the diagram of FIG. 20, of a system for maintaining generally constant light intensity by monitoring temperature of a heat sink on a substrate that also mounts a UV-LED assembly with a heat/temperature sensor mounted on the heat sink and then controlling the current or voltage to a fan dependent on the temperature sensed for increasing cooling as the UV-LED chips in the assembly heat up thereby to maintain a generally constant temperature which results in a generally constant light output from the UV-LED chips.

Another system 600 is graphically illustrated in FIG. 21. Here the system 600 for maintaining generally constant light intensity includes a heat/temperature sensor 602 which monitors the temperature of a heat sink 604 on a substrate 606 that also mounts an assembly 608 of UV-LED arrays 610 containing a plurality of UV-LED chips. The temperature sensed is used by a control circuit 612 to control the current or voltage to a variable speed fan 614 blowing cooling air on the heat sink 604 mounted on the substrate 606 mounting the assembly 608 of the UV-LED arrays 610. As the UV-LED chips heat up, the speed of the fan 614 is increased to increase the cooling of the heat sink 604 to cool the heat sink 604 and the UV-LED chips mounted on the substrate 606, thereby to maintain the UV-LED chips at a generally constant temperature which results in a generally constant light output from the UV-LED chips.

In both systems 500 and 600, the heat sink 512 or 604 is shown spaced from the UV-LED arrays 504 or 610 on the underside of the substrate 514 or 606. In actual practice, the heat sink 512 or 604 is preferably located on the substrate 514 or 606 directly above the UV-LED arrays 504 or 610

From the foregoing description it will be apparent that the method and device or apparatus of the present invention have a number of advantages, some of which have been described above and others of which are inherent in the invention.

Although embodiments of the invention have been shown and described, it will be understood that various modifications and substitutions, as well as rearrangements of components, parts, equipment, apparatus, process (method) steps, and uses thereof, can be made by those skilled in the art without departing from the teachings of the invention.

Accordingly, the scope of the invention is only to be limited as necessitated by the accompanying claims.

I claim:

1. An ultraviolet (UV) curing method for applying UV light to UV photo initiators in UV curable inks, coatings, or adhesives, on surfaces of products, articles, or other solid objects, comprising the steps of:
   emitting visible light from a group of visible light-emitting diode (LED) assemblies located in an array of rows of light emitting diodes secured to a panel to indicate to a user of the method that power is being supplied to all the light emitting diodes in the array of rows on the panel;
   emitting a first wavelength of UV light from a first group of UV LED assemblies in the array of rows secured to the panel onto the UV curable inks, coatings or adhesives on the surfaces of the products, articles or other solid objects, the first group being in different rows of the array of rows or being spaced apart in one or more rows of the array;
   emitting a second wavelength of UV light from a second group of UV LED assemblies secured to the panel onto the UV curable inks, coatings or adhesives on the surfaces of the products, articles or other solid objects, said second group of UV LED assemblies being in different rows of the array or being spaced apart in one or more rows of the array of UV LED assemblies, and said second wavelength of UV Light being different than said first wavelength of UV light;
   cooling the UV LED assemblies with a heat sink fixed to the panel and a variable speed fan;
   sensing the light intensity of the UV light emitted from the UV LED assemblies:
   sensing the temperature of the heat sink or UV LED assemblies;
   adjusting and controlling the speed of the variable speed fan in response to one of the sensed temperature of the heat sink or UV LED assemblies or of the light intensity sensed;
   maintaining the temperature of the UV LED assemblies at a generally constant temperature to maintain the light intensity of the UV light emitted on the UV curable items at a generally constant level;
   moving the panel in proximity to or adjacent the UV curable inks, coatings or adhesives on the surfaces of the products, articles or other solid objects while UV light is emitted from the first and second groups of UV LED assemblies;
   distributing the first and second wavelengths of UV light onto the UV curable inks, coatings or adhesives on the surfaces of the products, articles or other solid objects to cure the UV curable inks, coatings or adhesives on the surfaces of the products, articles or other solid objects with UV light of generally constant intensity.

2. The UV curing method of claim 1 wherein the first and second groups of UV LED assemblies emit UV light at wavelengths between 315 and 400 nm.

3. The UV curing method of claim 1 wherein the first group of UV LED assemblies emit UV light at a peak wavelength of 365 nm and the second group of UV LED assemblies emit UV light at a peak wavelength of 385 nm.

4. The UV curing method of claim 1 including:
   injecting an inert gas in a space between the panel and the UV curable items; and
   protecting the LED assemblies from splatter.

5. The UV curing method of claim 1 including the step of employing voltage matching techniques whereby the current drawn by the UV LED assemblies of the first and second groups of UV LED assemblies only varies between about 5% and about 10%.

6. The UV curing method of claim 1 wherein the group of visible light-emitting diode assemblies is a row of visible light-emitting diode assemblies in the array of rows of LED assemblies on the panel.

7. An ultraviolet (UV) apparatus for applying UV light to UV photo initiators in UV curable inks, coatings, or adhesives, on surfaces of products, articles or other solid objects, comprising:
   a panel;
   a group of visible light-emitting diode (LED) assemblies secured to said panel in an array of rows of light emitting diodes on the panel for emitting visible light for indicating to a user of the apparatus that power is being supplied to all the light emitting diodes in the array of rows of LEDs on the panel;
   a first group of UV LED assemblies being secured to said panel in different rows of the array or being spaced apart in one or more rows of the array for emitting a first wavelength of UV light on the UV curable inks, coatings or adhesives on the surfaces of the products, articles or other solid objects facing the first group of UV LED assemblies;
   a second group of UV LED assemblies secured to said panel in different rows of the array or being spaced apart in or more rows of the array for emitting a second wavelength of UV light on the UV curable inks, coatings or adhesives on the surfaces of the products, articles or other solid objects facing the second group of UV LED assemblies, said first wavelength of UV light being different than said second wavelength of UV light;
   a heat sink mounted to said panel for dissipating heat from said UV LED assemblies;
   a variable speed fan mounted adjacent said heat sink for blowing air on said heat sink or UV LED assemblies to cool said heat sink or said UV LED assemblies;
   a light sensor for sensing the intensity of UV light emitted from said UV LED assemblies; and,
   a control circuit coupled to said light sensor and to said variable speed fan for controlling the light intensity of the UV light emitted from said UV LED assemblies and the temperature of the UV LED assemblies by regulating the speed of the air blown by said variable speed fan on said heat sink or UV LED assemblies and by varying the speed of said variable speed fan in response to the sensed intensity of the UV light thereby to maintain a substantially constant intensity of light for the curing of the UV curable items;
   a panel-moving mechanism for moving said panel in proximity to or adjacent to the UV curable inks, coatings or adhesives on the surfaces of the products, articles or other solid objects facing the visible and UV LED assemblies while generally constant intensity UV light comprising the first and second wavelengths of UV light are emitted from the first and second groups of UV LED assemblies onto the UV curable inks, coatings or adhesives on the surfaces of the products, articles or other solid objects facing the first and second groups of UV LED assemblies;
   said control circuit also being operatively connected to the first and second groups of UV LED assemblies and the panel-moving mechanism for concurrently distributing the first and second wavelengths of UV light from the UV LED assemblies equally onto the UV curable inks, coatings or adhesives on the surfaces of the products, articles or other solid objects facing the first and second arrays of UV LED assemblies while said panel is being moved to cure the UV curable inks, coatings or adhesives on the products, articles or other solid objects with generally constant intensity UV light from said first and second groups of UV LED assemblies.

8. The UV curing apparatus of claim 7 wherein the first group of UV LED assemblies emit UV light at a peak wavelength of 365 nm and the second group of UV LED assemblies emit UV light at a peak wavelength of 385 nm.

9. The UV curing apparatus of claim 7 including a gas injector for injecting an inert gas in a space between the panel and the UV curable inks, coatings or adhesives on the surfaces of the products, articles or other solid objects facing the visible LED assemblies.

10. The UV curing apparatus of claim 7 including a splatter resistant protective device comprising a plastic or glass sheet or plate positioned between the array of rows of UV LED assemblies and the UV curable inks, coatings or adhesives on the surfaces of the products, articles or other solid objects facing the UV and visible LED assemblies for substantially preventing splatter from the UV curable inks, coatings or adhesives on the surfaces of the products, articles or other solid objects facing the UV and visible LED assemblies from contacting the array of rows of UV LED assemblies.

11. The UV curing apparatus of claim 7 wherein the UV LED assemblies comprise large junction UV LED chips over 400 microns on a side.

12. The UV curing apparatus of claim 7 including
a temperature sensor mounted adjacent said heat sink or UV LED assemblies and coupled to said control circuit for sensing the temperature of said heat sink or UV LED assemblies.

13. The UV curing apparatus of claim 7 including:
a printer with a printing head for printing UV curable inks, coatings or adhesives on the surfaces of the products, articles or other solid objects;
a turntable for carrying the printed UV curable items past the UV LED assemblies; and
a mechanism for rotating or indexing said turntable carrying the printed inks, coatings or adhesives on the surfaces of the products, articles or other solid objects past the UV LED assemblies.

14. The UV curing apparatus of claim 7 wherein:
said moving mechanism comprises a conveyor for moving the UV curable inks, coatings or adhesives on the surfaces of the products, articles or other solid objects past the UV LED assemblies as UV light is emitted from the UV LED assemblies onto the UV curable inks, coatings or adhesives on the surfaces of the products, articles or other solid objects.

15. The UV curing apparatus of claim 7 wherein said moving mechanism comprises an oscillator for oscillating or reciprocating said panel of UV LED assemblies in proximity to or adjacent said UV curable inks, coatings or adhesives on the surfaces of the products, articles or other solid objects as UV light is emitted from said UV LED assemblies onto the UV curable inks, coatings or adhesives on the surfaces of the products, articles or other solid objects.

16. The UV curing apparatus of claim 7 wherein said group of visible light-emitting diode assemblies is a row of visible light-emitting diode assemblies in the array of rows of LED assemblies on said panel.

* * * * *

UNITED STATES PATENT AND TRADEMARK OFFICE
CERTIFICATE OF CORRECTION

PATENT NO.       : 7,211,299 B2  
APPLICATION NO.  : 10/753947  
DATED            : May 1, 2007  
INVENTOR(S)      : Stephen B. Siegel It is certified that error appears in the above-identified patent and that said Letters Patent is hereby corrected as shown below:

Col. 11, lines 30-31, claim 1  
replace "cooling the UV LED assemblies with a heat sink fixed to the panel and a variable speed fan;"  
with --cooling the UV LED assemblies with a variable speed fan and a heat sink fixed to the panel;--.

Col. 12, line 1, claim 5  
replace "drawn by the UV LED assemblies of the first and second"  
with -- drawn by the UV LED chips of the first and second--.

Signed and Sealed this

Thirty-first Day of July, 2007

JON W. DUDAS  
*Director of the United States Patent and Trademark Office*